(12) United States Patent
Nishimura et al.

(10) Patent No.: US 11,404,629 B2
(45) Date of Patent: Aug. 2, 2022

(54) TREATING SOLUTION SUPPLY APPARATUS

(71) Applicant: SCREEN Holdings Co., Ltd., Kyoto (JP)

(72) Inventors: Junki Nishimura, Kyoto (JP); Hiroyuki Ogura, Kyoto (JP); Masahito Kashiyama, Kyoto (JP); Toru Momma, Kyoto (JP); Shoji Kirita, Kyoto (JP); Hidetoshi Sagawa, Kyoto (JP); Shogo Yoshida, Kyoto (JP)

(73) Assignee: SCREEN Holdings Co., Ltd.

(*) Notice: Subject to any disclaimer, the term of this patent is extended or adjusted under 35 U.S.C. 154(b) by 78 days.

(21) Appl. No.: 16/045,874

(22) Filed: Jul. 26, 2018

(65) Prior Publication Data
US 2019/0060963 A1 Feb. 28, 2019

(30) Foreign Application Priority Data

Aug. 23, 2017 (JP) .............................. JP2017-160312

(51) Int. Cl.
F04B 43/02 (2006.01)
H01L 43/02 (2006.01)
(Continued)

(52) U.S. Cl.
CPC .............. *H01L 43/02* (2013.01); *F04B 53/16* (2013.01); *F04B 53/20* (2013.01); *H01L 21/67017* (2013.01); *G03F 7/16* (2013.01)

(58) Field of Classification Search
CPC .......... F04B 17/03; F04B 23/00; F04B 23/04; F04B 23/06; F04B 43/0009;
(Continued)

(56) References Cited

U.S. PATENT DOCUMENTS 5,490,765 A * 2/1996 Bailey ................. F04B 43/0054
417/2
5,916,366 A 6/1999 Ueyama et al. ................. 118/52
(Continued)

FOREIGN PATENT DOCUMENTS

CN 100497731 C 6/2009
JP 2013-100825 A 5/2013

OTHER PUBLICATIONS

Authou: Purity Title: Fire Fighting System Date published (yyyy): 2011 or 2013 Date accessed (mm/dd/yyyy):Feb. 6, 2021 Link: https://www.purityfire.com/fire-fighting-system/fire-pump-system-electric-diesel-jockey-pump.html (Year: 2011 or 2013).*
(Continued)

*Primary Examiner* — Charles G Freay
*Assistant Examiner* — Chirag Jariwala
(74) *Attorney, Agent, or Firm* — Ostrolenk Faber LLP

(57) ABSTRACT

A treating solution supply apparatus which supplies a treating solution for treating a substrate includes a liquid passage for allowing the treating solution to flow therethrough; and a pump including a chamber with a variable volume for receiving and feeding the treating solution from/to the liquid passage, and a chamber driver electrically driven to vary the volume of the chamber. The liquid passage, chamber, and chamber driver are arranged in the stated order laterally.

19 Claims, 7 Drawing Sheets

(51) Int. Cl.
  *H01L 21/67* (2006.01)
  *F04B 53/16* (2006.01)
  *F04B 53/20* (2006.01)
  *G03F 7/16* (2006.01)

(58) Field of Classification Search
  CPC .. F04B 43/0081; F04B 43/025; F04B 43/026;
      F04B 43/02; F04B 43/04; F04B 53/20;
      F04B 53/16; G03F 7/16; G03F 7/26;
      H01L 21/67017
  See application file for complete search history.

(56) References Cited

U.S. PATENT DOCUMENTS

| | | | |
|---|---|---|---|
| 2005/0072358 A1 | 4/2005 | Katsuoka et al. | 118/719 |
| 2007/0128046 A1 | 6/2007 | Gonnella et al. | 417/2 |
| 2007/0128047 A1 | 6/2007 | Gonnella et al. | 417/2 |
| 2007/0258837 A1* | 11/2007 | Okumura | F04B 43/06 417/472 |
| 2012/0288379 A1* | 11/2012 | Laverdiere | F04B 43/02 417/53 |
| 2015/0048035 A1* | 2/2015 | Liao | B01D 35/02 210/120 |
| 2015/0092167 A1* | 4/2015 | Terashita | H01L 21/67017 355/30 |
| 2015/0300491 A1* | 10/2015 | Teshima | F04B 43/0054 92/48 |
| 2017/0107982 A1* | 4/2017 | Cedrone | F04B 19/04 |
| 2017/0232460 A1* | 8/2017 | Kashiyama | H01L 21/67017 239/590 |

OTHER PUBLICATIONS

Office Action dated Jan. 6, 2020 for corresponding Korean Patent Application No. 10-2018-0087114.
Notice of Allowance dated Mar. 13, 2020 for corresponding Taiwan Patent Application No. 107124460.
Office Action dated Jun. 15, 2021 for corresponding Chinese Patent Application No. 201810857481.6.

* cited by examiner

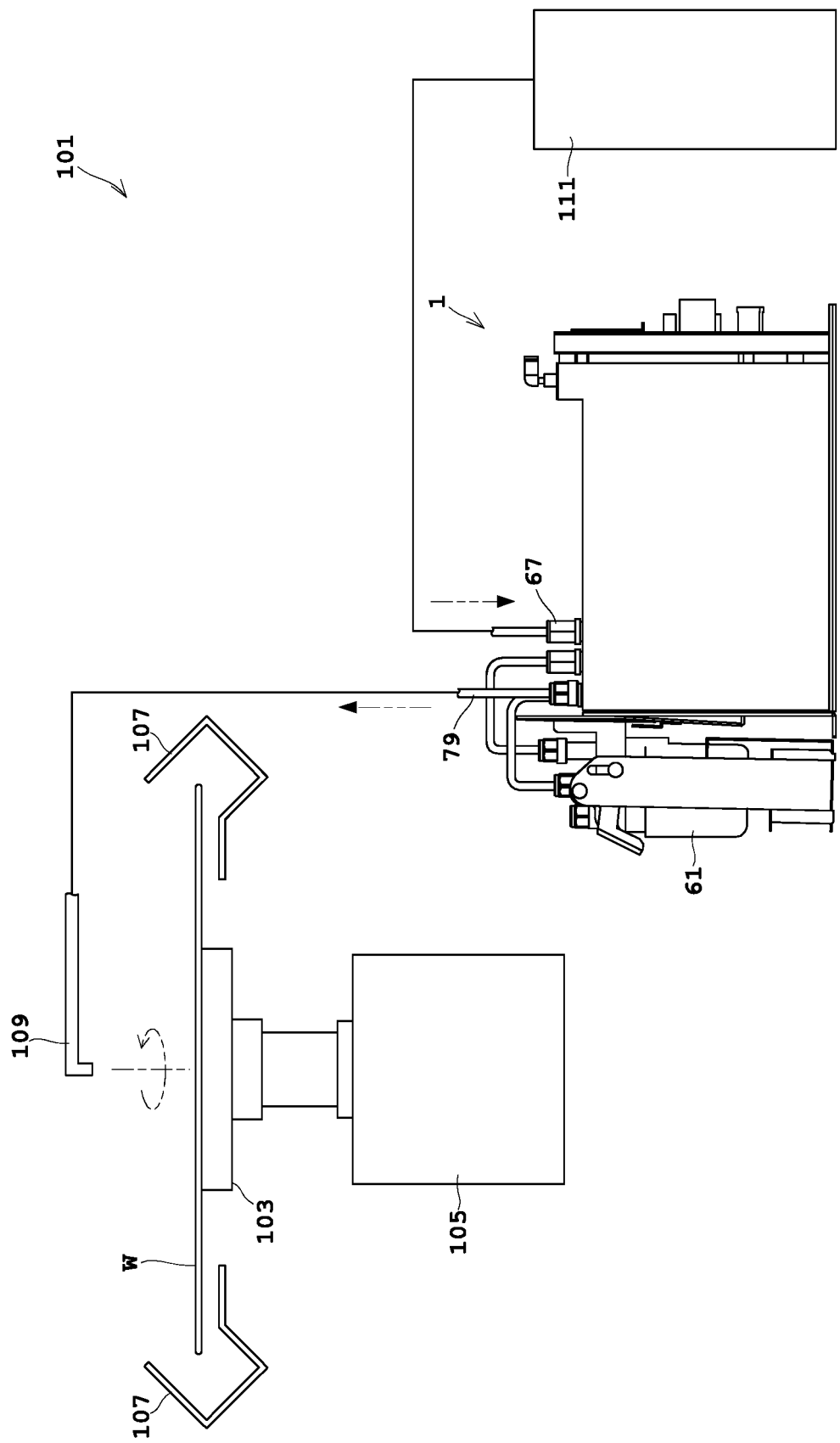

TREATING SOLUTION SUPPLY APPARATUS

BACKGROUND OF THE INVENTION

(1) Field of the Invention

This invention relates to a treating solution supply apparatus for supplying treating solutions to semiconductor wafers, substrates for liquid crystal displays, substrates for FPDs (Flat Panel Displays) such as organic EL (Electroluminescence) displays, substrates for magnetic disks, substrates for magneto-optical disks, substrates for photomasks, and substrates for solar cells (hereinafter called simply the substrates).

(2) Description of the Related Art

Conventionally, this type of apparatus includes intake piping for taking in a treating solution, output piping for outputting the treating solution to a substrate, an air valve for controlling flow of the treating solution through the intake piping and output piping, a chamber for sucking in the treating solution from the intake piping and feeding the treating solution into the output piping, and a motor for acting on the chamber to feed out the treating solution (see Japanese Unexamined Patent Publication No. 2013-100825, for example). In this apparatus, the intake piping, output piping, air valve and chamber, through which the treating solution flows, are arranged above the motor.

However, the conventional example with such a construction has the following problem.

With the conventional apparatus, ambient air is heated by the heat of the motor which operates electrically. As the heated air goes up, the heat is transmitted to the intake piping, output piping, and chamber arranged above the motor. This can result in alteration or deterioration of the treating solution in the piping and chamber.

SUMMARY OF THE INVENTION

This invention has been made having regard to the state of the art noted above, and its object is to provide a treating solution supply apparatus which, by inhibiting heat transmission to a treating solution, can prevent alteration and deterioration of the treating solution under the influence of heat.

To fulfill the above object, this invention provides the following construction.

A treating solution supply apparatus which supplies a treating solution for treating a substrate, according to this invention, comprises a liquid passage for allowing the treating solution to flow therethrough; and a pump including a chamber with a variable volume for receiving and feeding the treating solution from/to the liquid passage, and a chamber driver electrically driven to vary the volume of the chamber; wherein the liquid passage, the chamber, and the chamber driver are arranged in the stated order laterally.

According to this invention, the chamber driver which produces heat is disposed laterally of the liquid passage and chamber. Therefore, even if the heat of the chamber driver increases environmental temperature around the chamber driver, the liquid passage and chamber are never exposed to the heated air. That is, the heat is inhibited from transmitting to the liquid passage and chamber. The treating solution can therefore be prevented from alteration and deterioration under the influence of heat.

In this invention, it is preferred that the liquid passage, the chamber, and the chamber driver are arranged linearly.

The linear arrangement enables the chamber driver to operate efficiently.

In this invention, it is preferred that the pump has an air space between the chamber and the chamber driver for inhibiting heat of the chamber driver from transmitting to the chamber.

The air space can further inhibit heat transmission from the chamber driver to the chamber, thereby further inhibiting the influence of heat.

In this invention, it is preferred that the pump has a diaphragm mounted in the chamber.

The treating solution can be received and fed from/to the liquid passage by deformation of the diaphragm.

In this invention, it is preferred that the liquid passage includes a nonelectrically operable switch valve for permitting and blocking flow of the treating solution; the nonelectrically operable switch valve is openable and closable by an electric drive valve; and the electric drive valve is located adjacent the chamber driver and away from the chamber.

The electric drive valve which controls the nonelectrically operable switch valve produces heat. Since this drive valve is located adjacent the chamber driver, its heat can be inhibited from transmitting to the treating solution.

The nonelectrically operable switch valve is, for example, an air valve having a valving element biased by a biasing device which is operable by supplying and blocking air thereto, or an unbiased valving element driven by supplying and blocking air thereto or by supplying and blocking vacuum thereto. The electric drive valve is, for example, an electromagnetic valve with a valving element driven by electrifying and de-electrifying a solenoid.

In this invention, it is preferred that the apparatus further comprises a control panel for controlling the chamber driver; wherein the control panel is located adjacent the chamber driver and away from the chamber.

The control panel produces heat since it operates electrically. Since the control panel is located adjacent the chamber driver, its heat can be inhibited from transmitting to the treating solution.

In this invention, it is preferred that the liquid passage includes a filter; and the filter is located at an opposite end from the chamber driver across the chamber in plan view.

The heat of the chamber driver is inhibited from transmitting to the filter, and the filter is located at the end, which can facilitate a changing operation also.

In this invention, it is preferred that the pump comprises two pumps, which consist of a first pump and a second pump; the first pump is disposed upstream in respect of a flow of the treating solution; and the second pump is disposed downstream in respect of the flow of the treating solution, the second pump being located above the first pump.

Since the first pump 7 and second pump 9 are provided, the treating solution can be received and fed efficiently. Besides, since the first pump 7 and second pump 9 are arranged to overlap each other, their occupancy area can be made small.

In this invention, it is preferred that the first pump and the second pump are located in the same position with respective chamber drivers overlapping each other in plan view.

Although the two pumps are provided, the chamber drivers which produce heat are arranged in the same position, and this can inhibit the heat from transmitting to the treating solution.

In this invention, it is preferred that the liquid passage includes a filter; the second pump is connected to the liquid passage extending from the first pump through the filter; and the liquid passage interconnecting the filter and the second pump is arranged such that the treating solution flows downward from the filter to a position lower than the second pump, and thereafter flows upward to the chamber of the second pump, the liquid passage having a nonelectrically operable switch valve mounted on a portion thereof where the treating solution flows upward, the switch valve being nonelectrically driven to permit and block the flow of the treating solution.

Bubbles in the treating solution are captured by the filter, but part of the bubbles may enter the liquid passage connected to the second pipe. In this case, if the nonelectrically operable switch valve were mounted on a liquid passage through which the treating solution flows downward, the bubbles would easily be trapped in the structural portion in the flow path of the nonelectrically operable switch valve due to surface tension. With an additional influence of the buoyancy of bubbles, it would be difficult to feed the bubbles down to the second pump. So, the liquid passage is provided to flow the treating solution downward from the filter once, and the nonelectrically operable switch valve is provided on the portion through which the treating solution flows upward to the second pump. Consequently, even if the bubbles are caught in the structural portion in the flow path of the nonelectrically operable switch valve due to surface tension, the bubbles, with help of the buoyancy also, can be fed into the second pump. This can prevent bubbles from stagnating in the liquid passage downstream of the filter to the detriment of the receiving and feeding of the treating solution.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIG. 8 is a view showing an outline construction of a substrate treating system having the treating solution supply apparatus according to the embodiment.

DESCRIPTION OF THE PREFERRED EMBODIMENTS

One embodiment of this invention will be described hereinafter with reference to the drawings.

Figure 1:
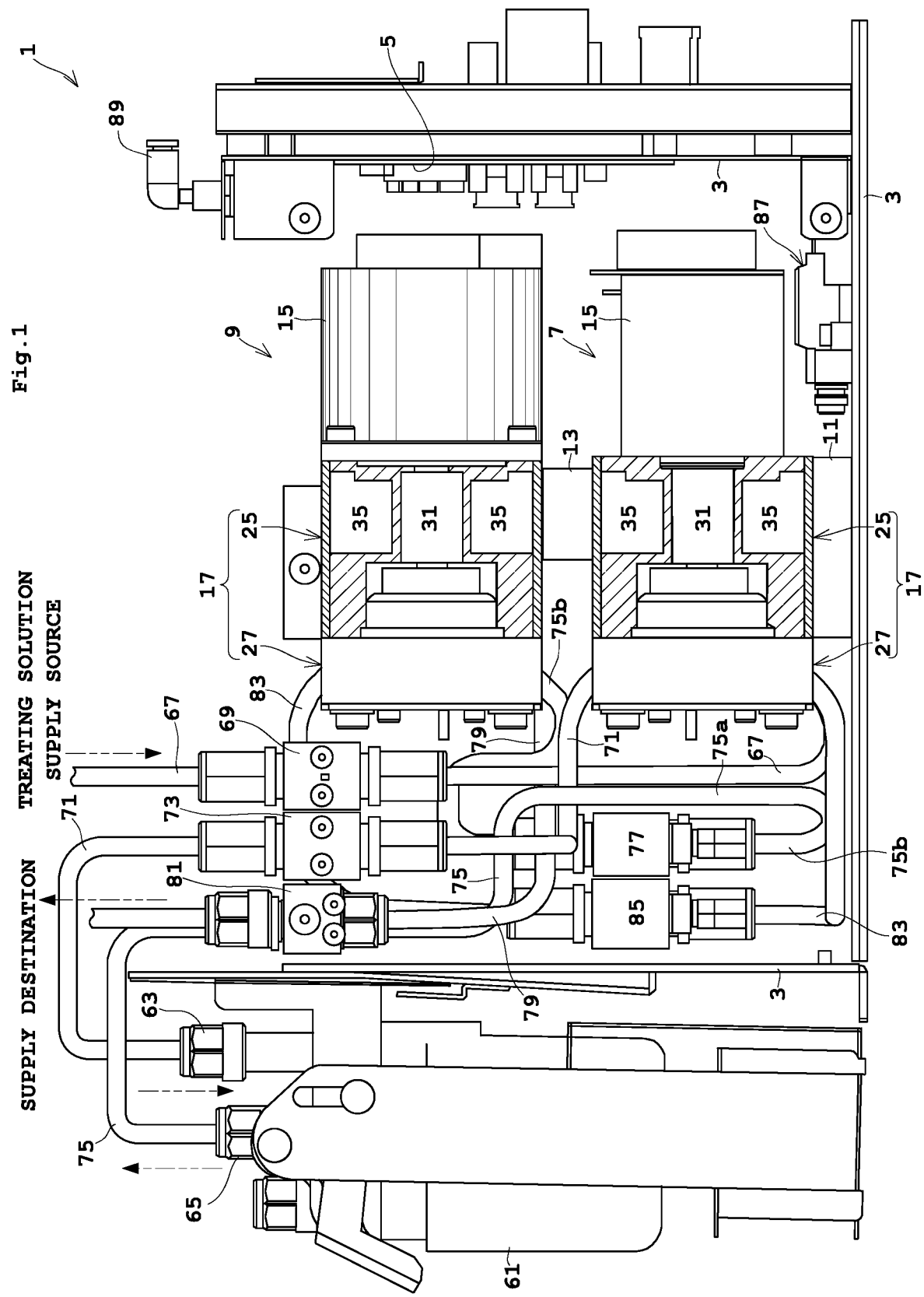
FIG. 1 is a side view showing an overall construction of a treating solution supply apparatus according to an embodiment.
Figure 2:
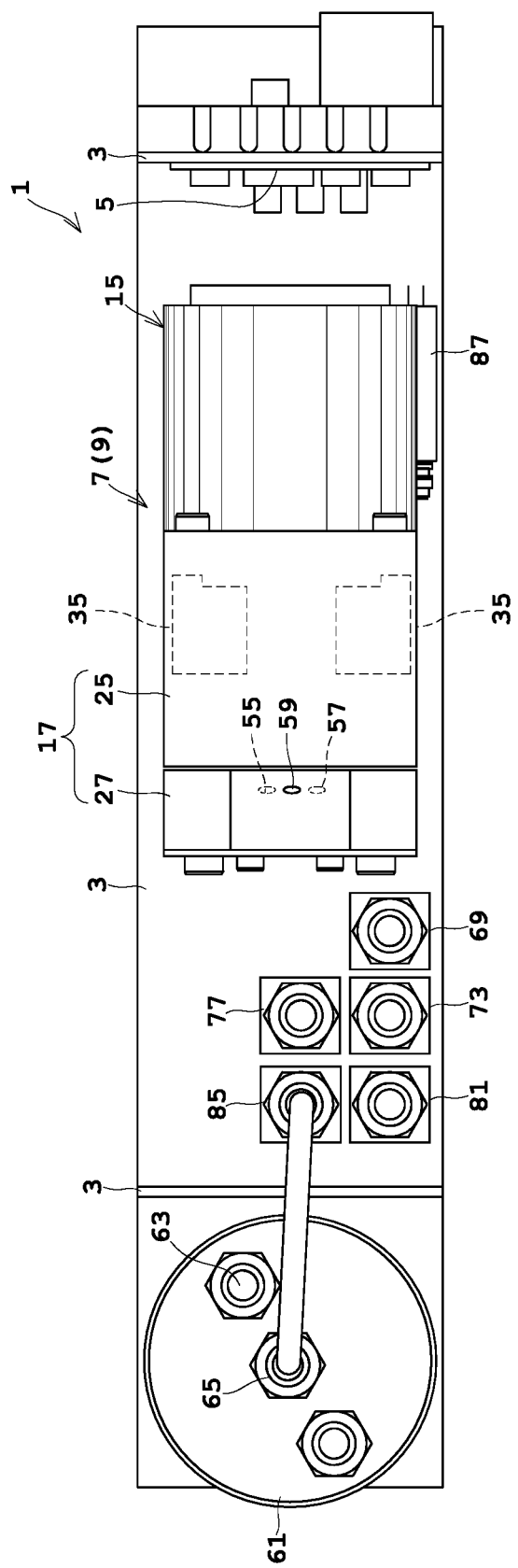
FIG. 2 is a plan view showing an outline construction of the treating solution supply apparatus according to the embodiment.
Figure 3:
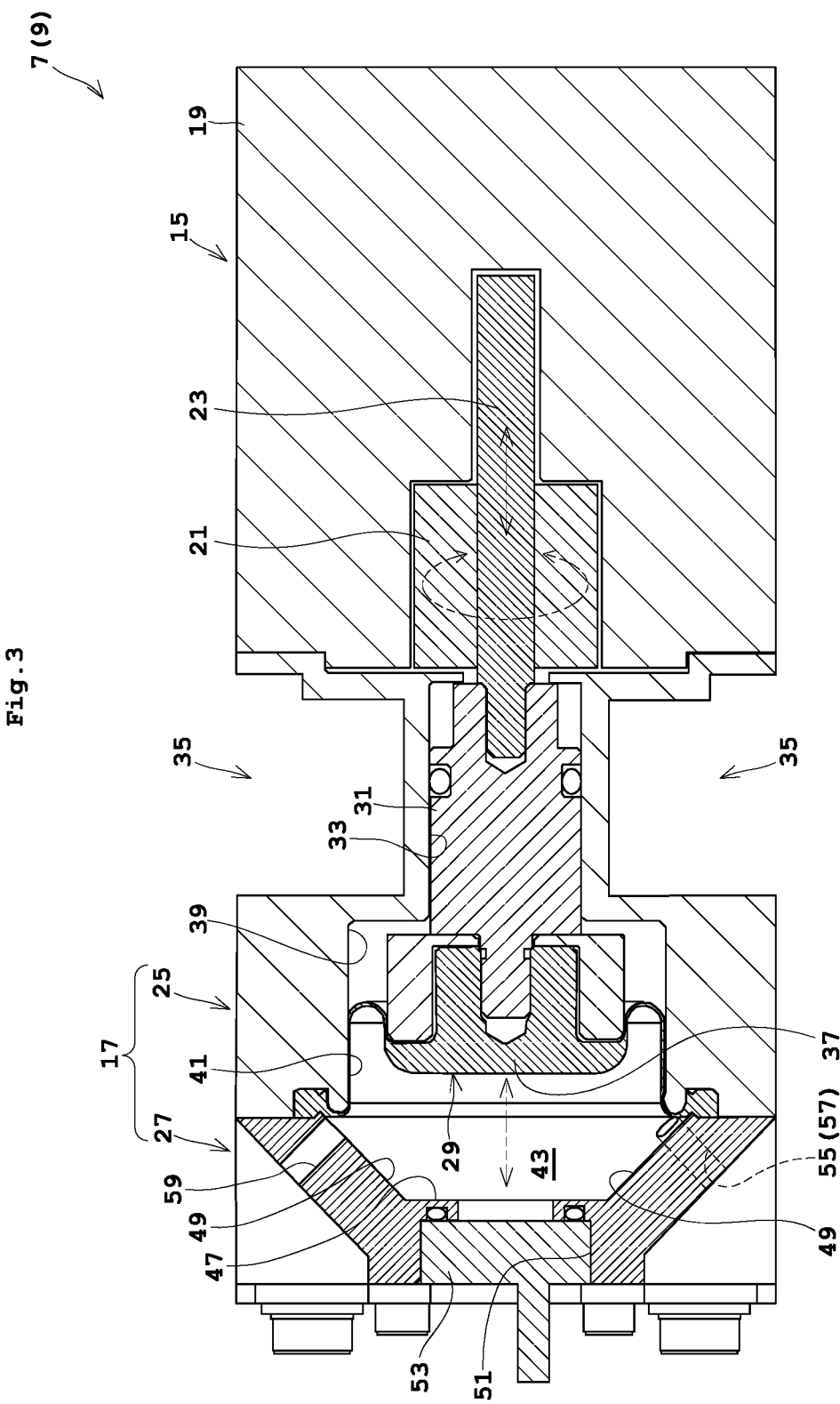
FIG. 3 is a view in vertical section of a pump.
Figure 4:
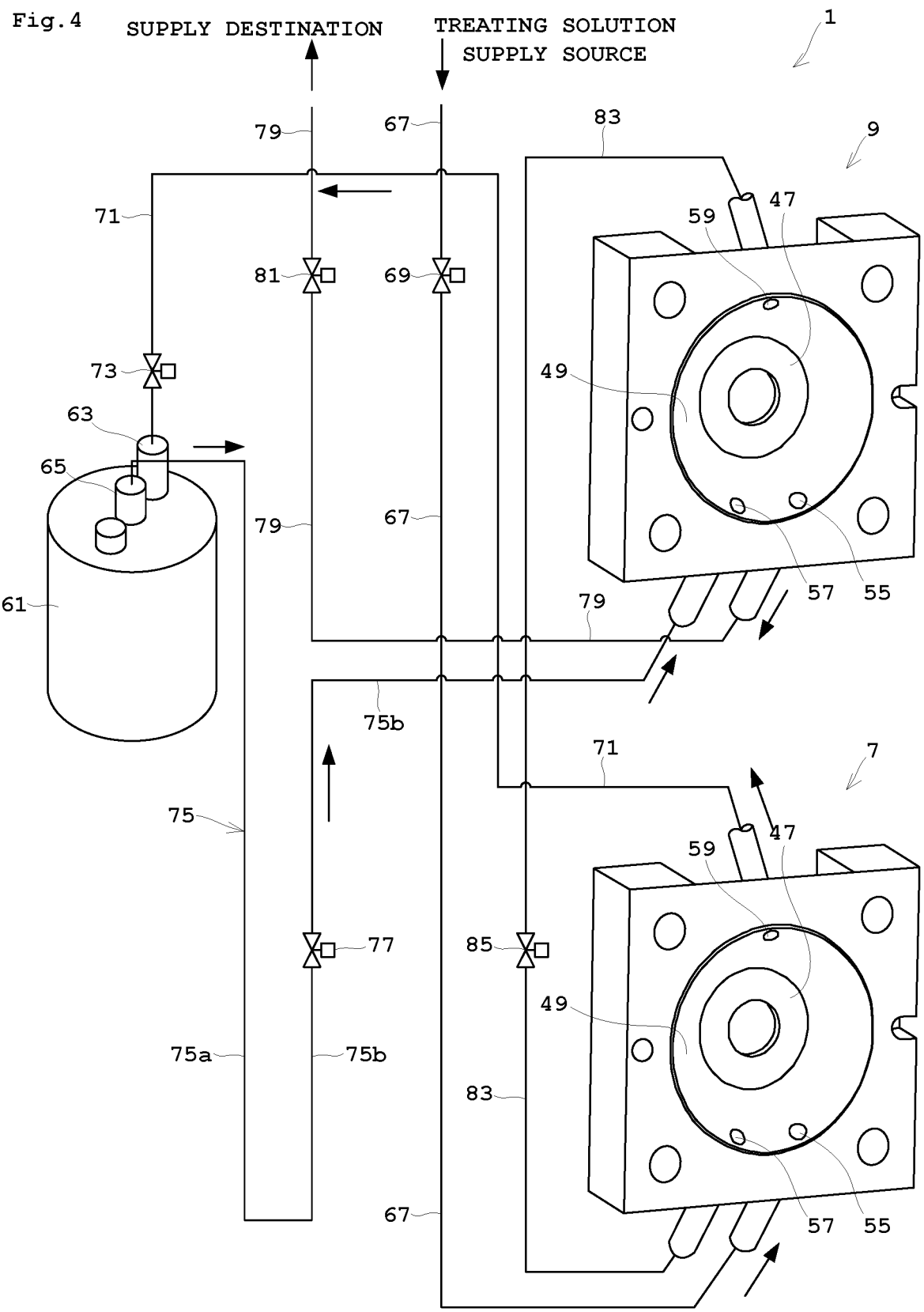
FIG. 4 is a view showing flow routes of a treating solution.

FIG. 1 is a side view showing an overall construction of a treating solution supply apparatus according to an embodiment. FIG. 2 is a plan view showing an outline construction of the treating solution supply apparatus according to the embodiment. FIG. 3 is a view in vertical section of a pump. FIG. 4 is a view showing flow routes of a treating solution.

A treating solution supply apparatus 1 is an apparatus which supplies a treating solution for treating a substrate not shown. The treating solution may be a photoresist solution having photosensitivity, for example. This treating solution supply apparatus 1 includes an apparatus frame 3 formed of a base plate disposed horizontally, and plate members erected at opposite ends of the base plate.

A control panel 5 is attached, as extending along an inner side surface, to a portion erected at a right side of the apparatus frame 3. This control panel 5 has a micro controller, a motor driver, memory, and so on. When the treating solution supply apparatus 1 is in operation, the control panel 5 is electrified and produces heat since it controls motors and other components described hereinafter.

A first pump 7 and a second pump 9 are arranged in a central region of the apparatus frame 3, adjacent the control panel 5. The first pump 7 is attached to the apparatus frame 3 as spaced from an upper surface of the apparatus frame 3 through a mount 11. The second pump 9 is attached above the first pump 7 as spaced from an upper surface of the first pump 7 through a mount 13 attached to an upper part of the first pump 7. As shown in FIG. 2, the first pump 7 and second pump 9 are arranged in the same position to overlap each other in plan view. This realizes a small occupancy area.

Since the first pump 7 and second pump 9 are the same in construction, the construction of only the first pump 7 will be described in detail hereinafter. The configurations of the first pump 7 and second pump 9 seem different in FIG. 1, and this is because their sectional planes are different.

The first pump 7 includes a motor 15 and a chamber 17. The motor 15 is a stepping motor, for example. Specifically, as shown in FIG. 3, the motor 15 has a stator 19 which generates a magnetic field on the inner circumference side, a rotor 21 in the shape of a tube rotatably mounted on the inner circumference side of the stator 19, and a shaft 23 which is meshed with the hollow of the rotor 21 to be movable forward and backward relative to the rotor 21 by rotation of the rotor 21. The motor 15 produces heat at the time of operation since a magnetic field is generated by electrifying the coils of the stator 19 to make the rotor 21 produce torque.

The chamber 17 is attached to one end of the shaft 23. A cover, omitted from FIG. 3, is attached to the other end of the shaft 23. The chamber 17 has a guide portion 25 and a chamber body 27 arranged in order away from the motor 15. A guide pin 31 is inserted in the guide portion 25. The guide pin 31 is connected at one end thereof to the shaft 23, and at the other end to a diaphragm 29 provided adjacent the chamber body 27. The guide portion 25 has a void space 35 formed to open toward outer peripheries from a position at a predetermined distance from a guide bore 33 that guides the guide pin 31. The void space 35 is formed to surround the outer circumference of the guide bore 33 when seen from the direction of the shaft 23.

The guide portion 25 has a recess 39 formed adjacent the chamber body 27 for accommodating a thick part 37 located centrally of the diaphragm 29 and the other end of the guide pin 31. The diaphragm 29 has a thin part 41 with an outer edge thereof fixedly clamped between mating surfaces of the guide portion 25 and chamber body 27. The diaphragm 29 is formed of resin, e.g. PTFE (polytetrafluoroethylene).

The chamber body 27 has a reservoir part 43 formed adjacent the recess 39. This reservoir part 43 assumes a circular shape when seen from the direction of the shaft 23, and has a vertical surface 47 formed opposite the guide portion 25 to have a vertical section perpendicular to the shaft 23. The vertical surface 47 is formed to have a diameter seen from the direction of the shaft 23 smaller than a diameter of the recess 39. The vertical surface 47 has a sloping surface 49 formed to extend from an outer circumference thereof to a circle with a slightly larger diameter than an inner circumferential surface of the recess 39. The vertical surface 47 has an inspection opening 51 formed therein which is in communication with an exterior of the reservoir part 43. A pressure sensor 53 is mounted in this inspection opening 51 for measuring pressure in the reservoir part 43.

The sloping surface 49 has a first communication port 55 and a second communication port 57 formed in lower parts thereof for communicating the reservoir part 43 with outside. When seen from the direction of the guide portion 25, the first communication port 55 and second communication port 57 are formed below the center of the reservoir part 43, and in a symmetrical positional relationship across a center line in a vertical direction of the reservoir part 43. Further, the first communication port 55 and second communication port 57 are formed in a positional relationship to have central axes thereof extending substantially perpendicular to the sloping surface 49. A third communication port 59 is formed in a position above the center of the reservoir part 43 and on the center line in the vertical direction of the reservoir part 43. In other words, the third communication port 59 is formed to communicate with the highest position in the reservoir part 43. This third communication port 59 is also formed in a positional relationship to have a central axis thereof extending substantially perpendicularly to the sloping surface 49.

The first pump 7 constructed as described above, when the motor 15 is driven to move the shaft 23 backward toward the motor 15, will assume a state where the thick part 37 of the diaphragm 29 is put into and retracted to the recess 39 as shown in FIG. 3 (sucking operation). Through this sucking operation, the treating solution is sucked in and received by the reservoir part 43. When the motor 15 is driven to move the shaft 23 forward toward the chamber body 27, the thick part 37 of the diaphragm 29 will be in a state of being advanced to a position close to the vertical surface 47 (feeding operation). Through this feeding operation, the treating solution is outputted from the reservoir part 43.

The apparatus frame 3 has a filter 61 detachably attached to a portion thereof erected at the left side in the side view of FIG. 1, i.e. at the side remote from the first pump 7 and second pump 9. The filter 61 filters the treating solution to capture particles and bubbles in the treating solution. The filter 61 includes an inlet 63 and an outlet 65. The inlet 63 receives the treating solution, and the outlet 65 discharges the treating solution filtered by the filter 61. Thus, the filter 61 is located at the end remote from the motor 15 across the chamber 17 in plan view, which can inhibit transmission of the heat to the filter 61. Further, since the filter 61 is located at the end, a changing operation can also be carried out easily.

As shown in FIG. 4, the first pump 7 has the first communication port 55 connected through first piping 67 to a treating solution supply source not shown. The first piping 67 has a switch valve 69 mounted thereon. The switch valve 69 permits or blocks the treating solution flowing down from above.

The first pump 7 has the third communication port 59 connected to the inlet 63 of the filter 61 through second piping 71. The second piping 71 has a switch valve 73 mounted thereon. The switch valve 73 permits or blocks the treating solution flowing down from above.

The filter 61 has the outlet 65 connected to the second communication port 57 of the second pump 9 through third piping 75. The third piping 75 includes a downward extension 75a extending from the filter 61 down toward the apparatus frame 3 forming a bottom surface below the second pump 9 and lower than a height position of the first pump 7, and an upward extension 75b extending from the downward extension 75a upward to the second pump 9. The third piping 75 has a switch valve 77 mounted on the upward extension 75b. The downward extension 75a leads the treating solution to flow downward, and the upward extension 75b leads the treating solution to flow upward.

The second pump 9 has the second communication port 55 connected through fourth piping 79 to a supply destination, not shown, of the treating solution. The fourth piping 79 has a switch valve 81 mounted thereon. The switch valve 81 permits or blocks the treating solution flowing up from below. Note that the switch valve 81 may be disposed outside the treating solution supply apparatus 1.

The second communication port 57 of the first pump 7 and the third communication port 59 of the second pump 9 are interconnected through fifth piping 83. The fifth piping 83 has a switch valve 85 mounted thereon. The switch valve 85 permits or blocks the treating solution flowing down from above and up from below.

The above switch valves 69, 73, 77, 81 and 85 are, for example, air-operated valves which permit liquid flow in response to an air supply, and block liquid flow in response to an air cutoff.

An electromagnetic valve unit 87 is disposed on the apparatus frame 3 forming the bottom surface, below the first pump 7. This electromagnetic valve unit 87 has a plurality of electromagnetic valves. Each electromagnetic valve contains a solenoid for electrically opening and closing the valve. The electromagnetic valve unit 87 has air received from an air supply 89 which receives air under predetermined pressure supplied from utility equipment, for example. Each electromagnetic valve of the electromagnetic valve unit 87 supplies or blocks the air required for operation of each of the switch valves 69, 73, 77, 81 and 85 described above. The electromagnetic valve unit 87, under control of the control panel 5, operates each electromagnetic valve to control opening and closing of each of the switch valves 69, 73, 77, 81 and 85.

The filter 61, first piping 67, second piping 71, third piping 75, fourth piping 79 and fifth piping 83 described above correspond to the "liquid passage" in this invention. The above motor 15 corresponds to the "chamber driver" in this invention. The void space 35 corresponds to the "air space" in this invention. The switch valves 69, 73, 77, 81 and 85 correspond to the "nonelectrically operable switch valves". The electromagnetic valve unit 87 corresponds to the "electric drive valve".

The treating solution supply apparatus 1 constructed as described above, when supplying the treating solution, operates as follows, for example.

Assume that, in an initial state, the electromagnetic valve unit 87 is operated by the control panel 5 to have each of the switch valves 69, 73, 77, 81 and 85 closed. In this state, the control panel 5 first operates the electromagnetic valve unit 87 to open the switch valve 69. Subsequently, the control panel 5 operates the first pump 7 to suck and receive the treating solution from the treating solution supply source into the reservoir part 43 of the chamber 17 through the first communication port 55. Specifically, the diaphragm 29 is moved toward the motor 15 to maximize the volume of the reservoir part 43 (sucking operation).

Next, the control panel 5, through the electromagnetic valve unit 87, closes the switch valve 69 and opens the switch valves 73 and 77. The control panel 5 operates the first pump 7, as shown in FIG. 3, to move the diaphragm 29 away from the motor 15 to minimize the volume of the reservoir part 43 (feeding operation), and operates the second pump 9 to move its diaphragm 29 toward the motor 15 to maximize the volume of the reservoir part 43 (sucking operation). Consequently, while being filtered through the filter 61, the treating solution outputted from the first pump 7 is sucked and received through the second communication port 57 of the second pump 9 into the reservoir part 43 of the chamber 17.

The control panel 5, through the electromagnetic valve unit 87, closes the switch valves 73 and 77 and opens the switch valve 81. The second pump 9 is operated to carry out a feeding operation to move the diaphragm 29 away from the motor 15 to minimize the volume of the reservoir part 43, thereby to output the treating solution from the first communication port 55 of the second pump 9 to the supply destination.

Although the bubbles in the treating solution are captured by the filter 61, part of the bubbles may pass through it and stagnate in the reservoir part 43 of the second pump 9. In that case, the switch valve 81 is closed and the switch valve 85 is opened. And the second pump 9 is made to carry out a feeding operation to feed the treating solution in a smaller amount than when the treating solution is normally supplied. The first pump 7 is made to carry out a sucking operation to suck the treating solution in a smaller amount than when the treating solution is normally supplied, whereby the bubbles are repeatedly captured by the filter 61. This can avoid the inconvenience of supplying the supply destination with a treating solution including bubbles.

As described above, the treating solution supply apparatus 1 performs a treating solution supplying operation. At this time, the control panel 5, the motors 15 of the first pump 1 and second pump 9, and the electromagnetic valve unit 87 produce heat. The components through which the treating solution flows are the chambers 17 and the liquid passage, the latter including the filter 61, first piping 67, second piping 71, third piping 75, fourth piping 79, and fifth piping 83. The chambers 17 and the liquid passage are arranged laterally away from the above heat sources. Therefore, even if the heat produced from the heat sources such as the motors 15 and electromagnetic valve unit 87 increases environmental temperature therearound, the chambers 17 and the liquid passage are never exposed to the heated air. That is, the heat is inhibited from transmitting to the chambers 17 and the liquid passage. The treating solution can therefore be prevented from alteration and deterioration under the influence of heat.

Since the first pump 7 and second pump 9 have the void spaces 35, which can inhibit the heat from the motors 15 from transmitting to the chambers 17, the influence of the heat can be further inhibited.

The first pump 7 is located upstream in the flow of the treating solution, and the second pump 9 downstream in the flow of the treating solution. While being able to receive and feed the treating solution efficiently, therefore, the first pump 7 and second pump 9 are arranged one over the other, which can make their occupancy area small. The first pump 7 and second pump 9 have the respective motors 15 arranged in the same position overlapping in plan view. Although the two motors are provided, their heat-emitting motors 15 are arranged in the same position, which can inhibit heat transmission to the treating solution.

Figure 5:
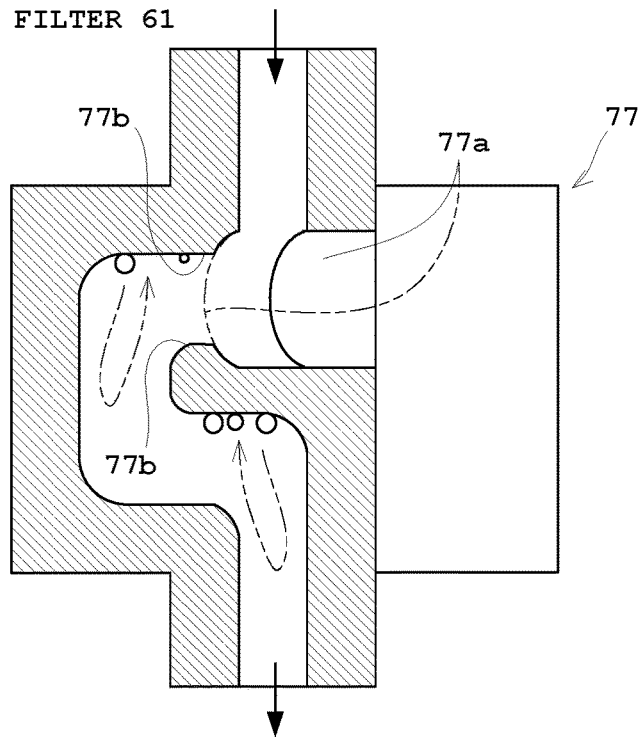
FIG. 5 is a schematic view showing a behavior of bubbles in the treating solution flowing down through a switch valve.
Figure 6:
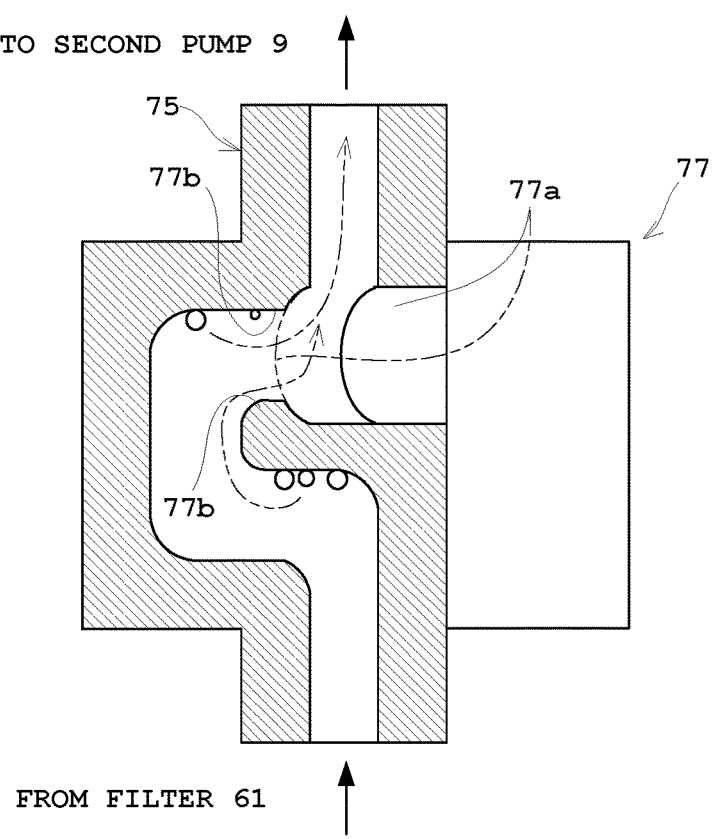
FIG. 6 is a schematic view showing a behavior of bubbles in the treating solution flowing up through the switch valve.

As described above, the apparatus in this embodiment includes the third piping 75 having the downward extension 75a and upward extension 75b. The upward extension 75b has the switch valve 77 mounted thereon. The third piping 75 serves to provide communication between the outlet 65 of the filter 61 and the second communication port 57 of the second pump 9, with the downward extension 75a reaching down adjacent the first pump 7 and then raised in form of the upward extension 75b. The piping is laid specially in such a roundabout way for the following reason. Reference is here made to FIGS. 5 and 6. FIG. 5 is a schematic view showing a behavior of bubbles in the treating solution flowing down through the switch valve 77. FIG. 6 is a schematic view showing a behavior of bubbles in the treating solution flowing up through the switch valve 77. The switch valve 77 has a movable valving element 77a, a valve seat 77b for receiving the valving element 77a, and a structural portion including a curved flow path.

If the switch valve 77 were mounted on piping through which the treating solution flows downward as shown in FIG. 5, bubbles would easily be trapped in the structural portion in the flow path of the switch valve 77 due to surface tension. With an additional influence of the buoyancy of bubbles, it would be difficult to feed the bubbles downward to the second pump 9. So, the downward extension 75a of the third piping 75 is provided to flow the treating solution downward from the filter 61 once, and the switch valve 77 is provided on the upward extension 75b through which the treating solution flows upward to the second pump 9. Consequently, as shown in FIG. 6, even if the bubbles are caught in the structural portion in the flow path of the switch valve 77 due to surface tension, the bubbles, with help of the buoyancy also, can be fed into the second pump 9. This can prevent bubbles from stagnating in the liquid passage downstream of the filter 61 to the detriment of the receiving and feeding of the treating solution.

Figure 7:
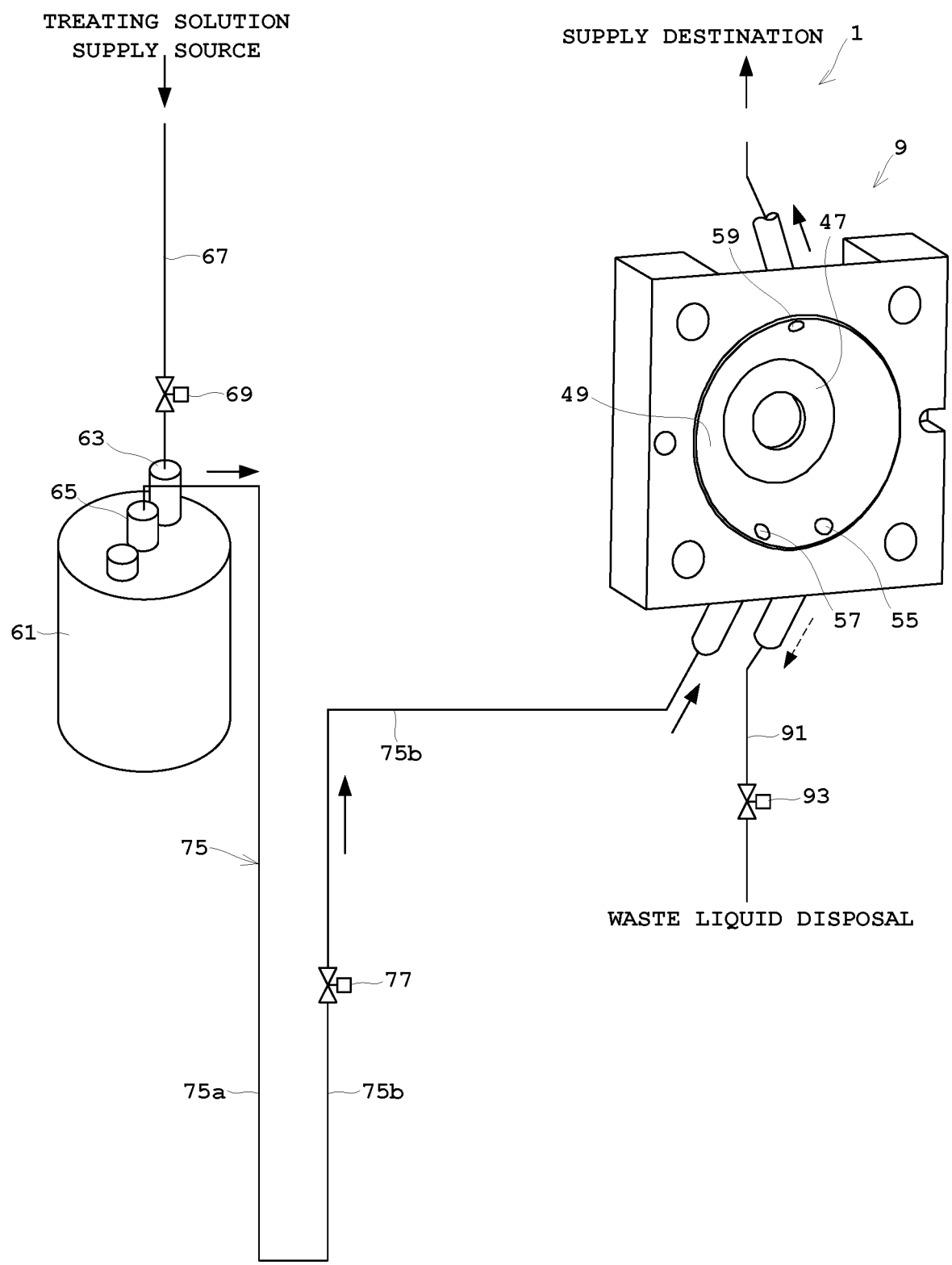
FIG. 7 is a view showing flow routes of the treating solution when one pump is provided.

The foregoing embodiment has been described taking for example the case of providing two pumps, i.e. the first pump 7 and second pump 9. This invention is not limited to such construction. Reference is now made to FIG. 7. FIG. 7 is a view showing flow routes of the treating solution when one pump is provided.

In this example, the first piping 67 connects the treating solution supply source to the inlet 63 of the filter 61, and has the switch valve 69. The third piping 75 connects the outlet 65 of the filter 61 to the second communication port 57 of the pump 9, and has the switch valve 77. In this case also, it is preferable that the third piping 75 has the downward extension 75a and upward extension 75b, and that the switch valve 77 is mounted on the upward extension 75b for the reason discussed above. A drain pipe 91 connects the first communication port 55 of the pump 9 to a waste liquid disposal, and has a switch valve 93. Also when the one pump 9 is provided, the same advantageous effect is produced by arranging the piping, filter 61 and chamber 17 to be laterally spaced from the motor 15 and control panel 5 as described hereinbefore.

The above treating solution supply apparatus 1 is well suited for a substrate treating system which treats substrates, for example. Reference is made to FIG. 8. FIG. 8 is a view showing an outline construction of a substrate treating system having the treating solution supply apparatus according to the embodiment.

This substrate treating system 101 is a single substrate processing apparatus which treats one substrate W at a time. A spin chuck 103 holds a substrate W to be spinnable in a horizontal position. A spin driver 105 spins the spin chuck 103 together with the substrate W about a vertical axis. A scatter preventive cup 107 surrounds areas around the spin chuck 103 to prevent scattering of the treating solution. A treating solution nozzle 109 is disposed above the spin chuck 103. The treating solution nozzle 109 is constructed swingable between a standby position laterally of the scatter preventive cup 107 and a supply position shown in FIG. 8. A treating solution supply source 111 stores the treating solution. The treating solution supply apparatus 1 described above has the first piping 67 connected to the treating solution supply source 111, and the fourth piping 79 connected to the treating solution nozzle 109.

The substrate treating system 101 constructed in this way can conveniently carry out treatment of the substrate W with the treating solution since adverse influences by heat are inhibited from affecting the treating solution.

This invention is not limited to the foregoing embodiment, but may be modified as follows:

(1) In the foregoing embodiment, the pumps 7 and 9 have the void spaces 35. This invention does not require the void spaces 35 as indispensable. That is, it is satisfactory without the void spaces 35 as long as the liquid passage, chambers, and chamber drivers are arranged in this order laterally.

(2) The foregoing embodiment has been described that each chamber 17 has the diaphragm 29. This invention may provide a construction using a tubephragm instead of the diaphragm 29.

(3) In the foregoing embodiment, each of the switch valves 69, 73, 77, 81 and 85 is operable by supplying and blocking air to the valving element biased by a biasing device such as a spring. However, the nonelectrically operable switch valves in this invention are not limited to this. The nonelectrically operable switch valves in this invention include all switch valves that are not electrically operable. For example, each switch valve employed herein may have an unbiased valving element driven by supply and blocking of air or by supply and blocking of vacuum.

(4) In the foregoing embodiment, the switch valve 77 is mounted on the upward extension 75b of the third piping 75 disposed downstream of the filter 61. Such a construction is not indispensable to this invention. That is, when there is no adverse, only a permissible, influence of bubbles due to the relationship of arrangement with the filter 61, the third piping 75 may be connected to the second pump 9 with the shortest distance in between.

This invention may be embodied in other specific forms without departing from the spirit or essential attributes thereof and, accordingly, reference should be made to the appended claims, rather than to the foregoing specification, as indicating the scope of the invention.

What is claimed is:

1. A treating solution supply apparatus which supplies a treating solution for treating a substrate, comprising:
    a base plate arranged in a horizontal direction;
    a liquid passage for allowing the treating solution to flow therethrough; and
    a pump including a chamber with a variable volume for receiving and feeding the treating solution from/to the liquid passage, and a chamber driver electrically driven to vary the volume of the chamber, wherein
    the liquid passage, the chamber, and the chamber driver are arranged on the base plate in that order in the horizontal direction,
    the liquid passage includes a plurality of pipes,
    the plurality of pipes connect a treating solution supply source and a supply destination through the chamber,
    the liquid passage is arranged on one side of the chamber in the horizontal direction,
    the chamber driver is arranged opposite the liquid passage with respect to the chamber in the horizontal direction,
    the pump comprises two pumps, which consist of a first pump and a second pump,
    the first pump is disposed upstream in respect of a flow of the treating solution,
    the second pump is disposed downstream in respect of the flow of the treating solution, the second pump being located above the first pump,
    the liquid passage further includes a filter,
    the second pump is connected to the liquid passage extending from the first pump through the filter,
    an outlet of the filter is arranged at a position higher than a communication port of the second pump in a vertical direction, the vertical direction being a direction perpendicular to the horizontal direction,
    the liquid passage interconnecting the filter and the second pump includes a downward extension, an upward extension, and a nonelectrically operable switch valve nonelectrically driven to permit and block the flow of the treating solution,
    the downward extension has a first one end and a first other end, the first one end connected to the outlet of the filter and the first other end extending along the vertical direction to a position lower than the second pump and lower than the filter, and
    the upward extension has a second one end and a second other end, the second one end connected to the first other end of the downward extension, and the second other end extending along the vertical direction and connected to the chamber of the second pump through the communication port, and the upward extension includes the nonelectrically operable switch valve.

2. The apparatus according to claim 1, wherein:
    the nonelectrically operable switch valve is openable and closable by an electric drive valve; and
    the electric drive valve is located adjacent the chamber driver and away from the chamber.

3. The apparatus according to claim 1, further comprising:
    a control panel for controlling the chamber driver;
    wherein the control panel is located on the chamber driver side with respect to the chamber in the horizontal direction.

4. The apparatus according to claim 1, wherein
    the filter is located opposite the chamber across a pipe located farthest away from the chamber in the horizontal direction among the plurality of pipes in the horizontal direction, and
    the filter, the plurality of pipes, the chamber, and the chamber driver are arranged linearly with respect to the horizontal direction.

5. The apparatus according to claim 1, wherein the first pump and the second pump are located in the same position with respective chamber drivers overlapping each other in plan view.

6. The apparatus according to claim 1, wherein the first other end of the downward extension is lower than the second pump and extends toward the base plate.

7. The apparatus according to claim 1, wherein the pump has a diaphragm mounted in the chamber.

8. The apparatus according to claim 7, wherein:
the nonelectrically operable switch valve is openable and closable by an electric drive valve; and
the electric drive valve is located adjacent the chamber driver and away from the chamber.

9. The apparatus according to claim 1, wherein the pump has an air space between the chamber and the chamber driver for inhibiting heat of the chamber driver from transmitting to the chamber.

10. The apparatus according to claim 9, wherein:
the nonelectrically operable switch valve is openable and closable by an electric drive valve; and
the electric drive valve is located adjacent the chamber driver and away from the chamber.

11. The apparatus according to claim 9, wherein the pump has a diaphragm mounted in the chamber.

12. The apparatus according to claim 11, wherein:
the nonelectrically operable switch valve is openable and closable by an electric drive valve; and
the electric drive valve is located adjacent the chamber driver and away from the chamber.

13. The apparatus according to claim 1, wherein the liquid passage, the chamber, and the chamber driver are arranged linearly in the horizontal direction.

14. The apparatus according to claim 13, wherein:
the nonelectrically operable switch valve is openable and closable by an electric drive valve; and
the electric drive valve is located adjacent the chamber driver and away from the chamber.

15. The apparatus according to claim 13, further comprising:
a control panel for controlling the chamber driver;
wherein the control panel is located on the chamber driver side with respect to the chamber in the horizontal direction.

16. The apparatus according to claim 13, wherein the pump has an air space between the chamber and the chamber driver for inhibiting heat of the chamber driver from transmitting to the chamber.

17. The apparatus according to claim 16, wherein:
the nonelectrically operable switch valve is openable and closable by an electric drive valve; and
the electric drive valve is located adjacent the chamber driver and away from the chamber.

18. The apparatus according to claim 13, wherein the pump has a diaphragm mounted in the chamber.

19. The apparatus according to claim 18, wherein:
the nonelectrically operable switch valve is openable and closable by an electric drive valve; and
the electric drive valve is located adjacent the chamber driver and away from the chamber.

* * * * *